(12) United States Patent
Carter et al.

(10) Patent No.: US 6,221,168 B1
(45) Date of Patent: Apr. 24, 2001

(54) HF/IPA BASED PROCESS FOR REMOVING UNDESIRED OXIDES FORM A SUBSTRATE

(75) Inventors: Lawrence E. Carter, Charlottesville, VA (US); Brent Schwab, Burnsville; Robert T. Fayfield, St. Louis Park, both of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/098,096

(22) Filed: Jun. 16, 1998

(51) Int. Cl.[7] ............... B08B 5/00; C09K 13/08; C23F 1/12
(52) U.S. Cl. ............... 134/1; 134/1.3; 216/58; 216/79
(58) Field of Search ................... 134/1, 1.3, 11; 438/706, 708, 743, 906; 216/58, 79

(56) References Cited

U.S. PATENT DOCUMENTS

| | | | |
|---|---|---|---|
| 4,746,397 | * 5/1988 | Maeda et al. | 216/90 |
| 5,022,961 | * 6/1991 | Izumi et al. | 438/743 |
| 5,294,568 | 3/1994 | McNeilly et al. | 437/235 |
| 5,439,553 | * 8/1995 | Grant et al. | 216/58 |
| 5,470,799 | 11/1995 | Itoh et al. | 437/238 |
| 5,580,421 | * 12/1996 | Hiatt et al. | 438/708 |
| 5,814,156 | 9/1998 | Elliott et al. | 134/1 |
| 5,922,219 | * 7/1999 | Fayfield et al. | 216/58 |
| 6,015,759 | 1/2000 | Khan et al. | 428/707 |

FOREIGN PATENT DOCUMENTS

98/19336   5/1998   (WO).

OTHER PUBLICATIONS

"Vapor HF Etching For Low Temperature Silicon Epitaxy" by Christopher P. D'Emic, et al, *Mat. Res. Soc. Symp. Proc.* vol. 259, 1992 Materials Research Society., pp. 479–485.

"A Complementary Wafer Cleaning and Growth Process for Low Temperature, Defect Free, Selective Silicon Epitaxy" by Jon T. Fitch et al, *Mat. Res. Soc. Symp. Proc.* vol. 259, 1992 Materials Research Society, pp 487–492.

(List continued on next page.)

*Primary Examiner*—Randy Gulakowski
*Assistant Examiner*—Saeed T. Chaudhry
(74) *Attorney, Agent, or Firm*—Vidas, Arrett & Steinkraus

(57) ABSTRACT

A method for treating a microelectronics substrate to produce a surface with improved characteristics for subsequent processing. The substrate is treated with HF, IPA, and an inert gas in a narrow range of conditions to remove unwanted oxide layers. The resulting surface is useful for processes like epitaxial deposition which benefit from a clean silicon surface with a low oxygen content.

29 Claims, 3 Drawing Sheets

OTHER PUBLICATIONS

"Optimization of Si–Wafer Cleaning and the Use of Buffer–Layers For Epitaxial Growth of Sige–Layers by VLPCVD ATT=650 C.", by Matty R. Caymax et al, *Mat. Res. Soc. Symp. Proc.* vol. 259, 1992 Materials Research Society, pp. 461–466.

"Room–Temperature HF Vapour–Phase Cleaning For LPCVD EPI of Si and SIGe", by A.E.T. Kuiper et al, *Mat. Res. Soc. Symp. Proc.* vol. 259, 1992 Materials Research Society., pp. 473–478.

"Low–temperature silicon cleaning via hydrogen passivation and conditions for epitaxy" by S.S. Lyer et al in Appl. Phys. Lett. 57(9), Aug. 27, 1990, pp.893–895.

"Low–temperature silicon epitaxy by ultrahigh vacuum/chemical vapor deposition" by B. S. Meyerson, in *Appl. Phys. Lett.* 48(12), Mar. 24, 1986, pp.797–799.

"Low–Temperature (900° C) Si Epitaxial Growth on Si(100) after HF Treatment" by Akihiro Miyauchi et al in *Electrochem. Soc.*, vol. 137, No. 10, Oct. 1990, pp.3257–3260.

"Characterization of Oxide Etching and Wafer Cleaning Using Vapor–Phase Anhydrous Hf and Ozone", in Barbara Froesch et al.

"Precise Control of $SiO_2$ Etching Characteristics Using Mono–Layer Absorption of $HF/H_2O$ Vapor", by Naruhiko Nakanishi et al in 1995 Internation Conference on Solid State Devices and Materials, Yokohama, 1995.

"Gas/Vapor Phase Hf/Alcohol Silicon Dioxide Etching" by John Grant et al, Abstract No. 282 in *ECS Ex. Abst.* 1993\? 1995?, pp.457–458.

"Hydrogen Fluoride Vapor Etching for Pre–EPi Silicon Surface Preparation", by Robert McIntosh et al in *Journal of Electronic Materials*, vol. 21, No. 1, 1992, pp.57–60.

"The Role of Chemical Species in the Passivation of <100> Silicon Surfaces by HF in Water–Ethanol Solutions" by B. Garrido et al *J. Electrochem. Soc.* vol. 143, No. 12, Dec. 1996, pp.4059–4066.

"Low Temperature Silicon Surface Cleaning by HF Etching/Ultraviolet Ozone Cleaning (HF/UVOC) Method (II)—in situ UVOC", by Tetsuya Kaneko, et al, Research Institute of Electrical Communication, Tohoku University, Sendai 980, published Oct. 21, 1989, pp.2425–2429.

"Low Temperature Silicon Surface Cleaning by HF Etching/Ultraviolet Ozone Cleaning (HF/UVOC) Method (I)—Optimization of the HF Treatment" by Maki Suemitsu et al, Research Institute of Electrical Communication, Tohoku University, Sendai 980, published Oct. 21, 1989, pp.2421–2424.

"Study of HF–Treated Heavily–Doped Si Surface Using Contact Angle Measurements", by Yasuhiro Sato et al, *Jpn. J. Appl. Phys.* vol. 33 (1994), pp.6508–6513.

"Reduced Pressure Etching of Thermal Oxides in Anhydrous HF/Alcoholic Gas Mixtures" by Kevin Torek et al in *J. Electrochem. Sec.* vol. 142, No. 4, Apr. 1995, pp.1322–1326.

"Vapor–Phase–Etching Technology: Exploring Surface Sensitivities and Uniform Oxide Etching" by Glenn L. Nobinger et al, in *MICROCONTAMINATION*, Apr. 1992, pp.21–26 and pp. 68–69.

"Thermal Oxide and TEOS Oxide Using Anhydrous HF and $CH_2OH$" by Chun Su Lee et al, in *J. Electrochem. Soc.* vol. 143, No. 3, Mar. 1996, pp. 1099–1003.

"Etching of $SiO_2$ With Anhydrous HF and Organic Solvent Vapors", by Kevin Torek et al in Proc of the 2nd Int. Symp. on Ultra–Clean Processing of Silicon Surf. (USPSS'94), pp.251–254.

"Investigation of Thermal Removal of Native Oxide from Si(100) Surfaces in Hydrogen for Low–Temperature Si CVD Epitaxy" by Tatsuya Yamazaki et al in *J. Electrochem. Soc.* vol. 139, No. 4. Apr. 1992., pp.1175–1180.

Butterbaugh, Jeffery W. et al., "Gas–Phase Etching of Silicon Oxide with Anhydrous HF and Isopropanol", Third International Symposium on Cleaning Technology in Semiconductor Manufacturing Electrochemical Society Proceedings, 94:374–383 (1994), XP002116888.

Iyer, S. S. et al., "Low–temperature silicon cleaning via hydrogen pssivation and conditions", *Appl. Phys. Lett.* 57:893–895 (Aug. 1990).

* cited by examiner

HF/IPA BASED PROCESS FOR REMOVING UNDESIRED OXIDES FORM A SUBSTRATE

FIELD OF THE INVENTION

This invention relates to treating microelectronics substrates. In particular, the invention provides a method for treating substrates whereby the surface generated has improved characteristics. The resulting surfaces are particularly useful for subsequent processing steps including deposition of thin films.

BACKGROUND OF THE INVENTION

Deposition of epitaxial silicon is one of many thin film deposition processes used in the manufacture of microelectronic devices. While this process is currently important, we anticipate that it will grow in importance as future generations of devices require selective deposition of epitaxial silicon layers. The ideal starting surface for deposition of epitaxial silicon is a completely oxygen- and carbon-free silicon surface. Any oxygen content in the starting surface will result in defects in the deposited silicon. This type of surface is often equated with a hydrogen-terminated surface, although the presence of fluorine and chlorine atoms at the surface may be acceptable as long as the oxygen concentration is suitably low.

Current processes for epitaxial silicon deposition require a pre-clean to remove any oxide on the areas targeted for deposition. The pre-clean can use either an aqueous solution of hydrogen fluoride (HF), or a gas phase HF oxide removal process such as those disclosed in U.S. Pat. No. 4,749,440 (Blackwood et al.), U.S. Pat. No. 5,022,961 (Izumi et al.), or U.S. Pat. No. 5,234,540 (Grant et al.). This is followed by a hydrogen bake at temperatures over 800° C. for several minutes to provide the best possible surface for the subsequent deposition.

The above process sequence is effective for producing an epitaxial silicon layer, but the high temperature hydrogen bake poses potential problems due to diffusion of dopant atoms. In many selective epitaxy applications, at least a portion of the eventual source and drain dopant profiles will be in place prior to the selective epitaxy. Once the dopant profiles are in place, any steps which heat the wafer to high temperatures will allow diffusion of dopant atoms which will reduce the sharpness of the dopant profiles. This can lead to degradation of device performance and limit the ability to reduce the size of a device. Thus, it is desirable to minimize the number and length of high temperature steps once dopant profiles are in place.

A cleaning step which removes all of the oxide from the silicon substrate without roughening the surface may provide a suitable surface for deposition without performing a hydrogen bake. One potential method for eliminating the hydrogen bake is to perform a gas phase HF oxide removal step immediately prior to starting epitaxial deposition. A completely gas phase HF removal step has no rinse, which prevents any regrowth of native oxide on the surface. A completely gas phase HF removal step may also be performed at reduced pressures, making the process compatible with other vacuum equipment. This would allow the HF process to either be carried out in the deposition chamber itself or in a separate chamber directly connected to the deposition chamber. This eliminates the need for exposure to atmosphere during transfer of the wafer to the deposition chamber which also reduces the likelihood for native oxide regrowth.

Previous attempts to use a completely gas phase HF oxide removal step to eliminate the need for a hydrogen pre-bake have shown only limited success.

Iyer et al., *Appl. Phys. Lett.*, Vol. 57, p. 893 (1990), studied gas phase HF oxide removal without a hydrogen pre-bake as a clean prior to both molecular beam epitaxy (MBE) and ultra high vacuum chemical vapor deposition (UHV/CVD) of silicon. The MBE depositions were carried out at 550° C., while the UHV/CVD experiments were performed between 700 and 850° C. However, the maximum silicon deposition rate in these experiments was on the order of 50 angstroms/minute, which is an order of magnitude slower than the rate needed in practical single wafer deposition tools.

Kuiper et al., *Mat. Res. Soc. Symp. Proc.*, Vol. 259, p. 473 (1992), also reported deposition of epitaxial silicon after gas phase HF treatment. They achieved reasonable growth rates at deposition temperatures between 700 and 750° C., but they reported a defect density of 1,500 defects/cm$^2$ in the resulting epitaxial layer.

Aoyama et al., *J. Electrochem. Soc.*, Vol. 140, p. 366 (1993), employed $F_2$/Ar in the presence of ultraviolet (UV) light to prepare silicon substrates for epitaxial silicon deposition. Without using an $H_2$ pre-bake, they deposited silicon at 650° C. but only achieved a silicon deposition rate of 75 angstroms/minute.

Therefore a need remains for a process for surface preparation which can be run at commercially practical rates and effectively reduce the thermal load needed to put the surface in condition for an epitaxial silicon deposition.

SUMMARY OF INVENTION

It has now been unexpectedly discovered that a known gas phase etch process using HF and isopropyl alcohol (IPA), when employed over a very narrow range of process condition parameters, can produce the desired improved surface condition under conditions and rates found in current industrial tools. The resulting surface is useful whenever it is desirable to produce a silicon surface with a minimum amount of residual oxygen, especially for preparing a silicon surface for a subsequent deposition of epitaxial silicon.

The etch reaction process of the invention is run at a pressure of from 125 to 175 torr pressure using a gas mixture of HF, isopropyl alcohol and nitrogen in a volume ratio of about 20–30:1:20–30, respectively.

The invention provides a silicon surface which gives remarkably lower incidence of light point defects after epitaxial silicon deposition. Thus, the present invention allows for reduction of the number of high temperature steps and/or the length of these steps in a subsequent deposition process. In particular, this improved process allows for a lower temperature and/or shorter hydrogen bake prior to deposition, and in some cases may allow for elimination of the hydrogen bake step entirely. A further aspect of the present invention, therefore is a process for depositing a film, especially an epitaxial silicon film, in which prior to the deposition step, the substrate surface is subjected to an HF/IPA etch process run at a pressure of from 125 to 175 torr pressure using a gas mixture of HF, isopropyl alcohol and nitrogen in a volume ratio of about 20–30:1:20–30, respectively.

DETAILED DESCRIPTION OF INVENTION

The present invention provides a process for achieving an improved surface quality on a semiconductor substrate. The invention achieves the desirable surface quality by removing oxide from the substrate prior to epitaxial silicon deposition. The nature of this oxide will vary depending on the history of the substrate. For instance, the oxide may be a sacrificial thermal oxide or deposited oxide generated during a previous process. It may also be a native oxide grown on the surface during exposure to air.

To remove the oxide from the desired deposition areas, the substrate is placed in a chamber capable of maintaining a reduced pressure environment. The gas environment in the chamber prior to initiating the etch reaction suitably is composed entirely of non-reactive gas. The environment in the chamber may contain other gases at the time the substrate is inserted, but the chamber is ideally purged with a non-reactive gas after placing of the substrate. $N_2$ is preferred for the non-reactive gas, but other traditionally inert gases such as argon or a combination of inert gases may also be used. Non-reactive gases may also include gases which do not react with the specific substrate to be treated or with the specific process gases used for treatment.

The pressure in the chamber during insertion of the substrate may be any pressure which is convenient for the transfer. Once the substrate has been placed in the chamber and the non-reactive gas environment established, the pressure in the chamber is modified to between about 125 and about 175 Torr, preferably about 150 Torr. At this time the temperature of the wafer should also be established at the desired processing temperature.

The substrate is then treated by introducing HF, IPA, and $N_2$ into the chamber. The relative volume ratio of these gases is within a narrow range. In particular both the HF and $N_2$ components should be introduced at a rate of 20–30 times, more preferably 22–28 times the flow rate of the IPA component. Most preferably the ratio of HF:IPA:$N_2$ is about 25:1:25. The flows of these gases are continued until all oxide has been removed from the desired deposition areas. Complete removal of these oxide layers may require 'overetch', or etching for a longer period time than would be indicated based on bulk oxide etch rates. Finally, the gas flows are halted and the chamber is pumped down to below 1 torr to end the process. After delivery of the HF/IPA/inert gas mixture is complete, the resulting surface is generally suitable for a subsequent deposition process. In some cases where the subsequent deposition is a epitaxial silicon deposition a hydrogen bake step may still be desirable, but in such cases the hydrogen bake step can be run at a lower temperature and/or for a shorter time than would be required following other HF gas phase etch steps run at commercially acceptable etch rates.

Figure 1:
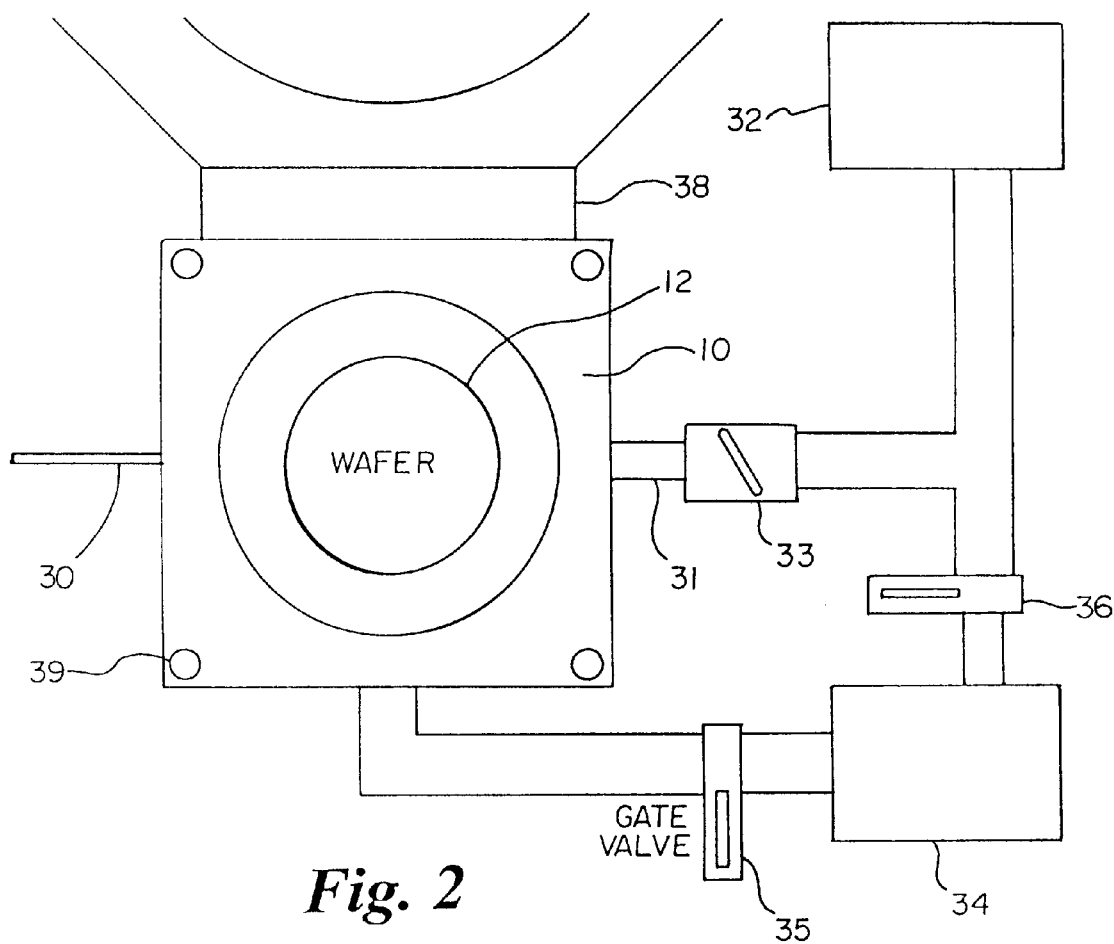
FIG. 1 schematically depicts a top view of an embodiment of an apparatus suitable for carrying out the inventive process.
Figure 2:
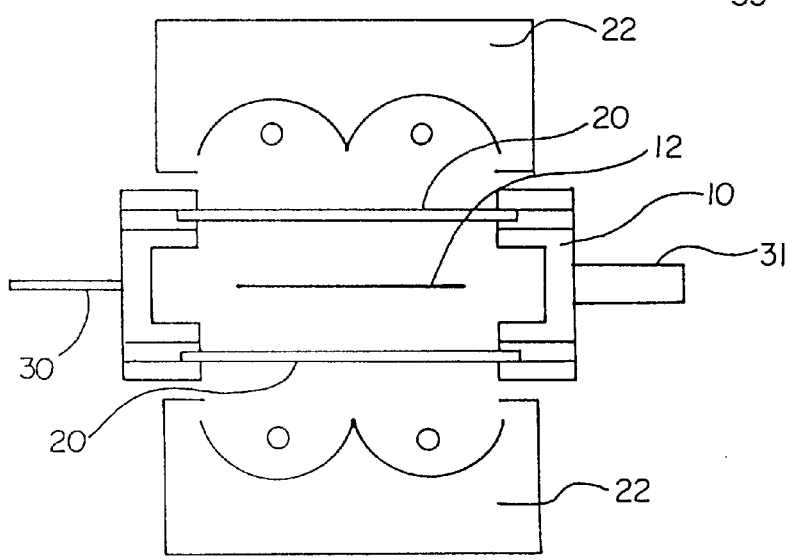
FIG. 2 schematically depicts the chamber of FIG. 1 from a side view.

Referring to the figures, FIGS. 1 and 2 illustrate an apparatus suitable for carrying out the inventive process. Substrate 12 is located in reaction chamber 10. Reaction chamber 10 may be constructed of any combination of materials suitable for containing the gases described in this invention. An exemplary material from which the chamber may suitably be constructed is aluminum with a Needox coating, which is available from General Magnaplate of Racine, Wis. Windows 20 are optional, and should be transparent to any radiation which is desired in the chamber, such as the output of optional UV radiation source 22. Gas may enter the chamber through inlet port 30 and may leave the chamber through exhaust port 31. Gas may be delivered to inlet port 30 by any suitable delivery system. Vacuum pump 32 is connected to exhaust port 31 to allow the chamber to be evacuated. A throttle valve 33 is used to regulate the pressure in the chamber. Vacuum pump 32 should be able to maintain a vacuum level in the chamber of below 1 Torr, although more powerful pumps which can maintain higher vacuums may also be used. Rapid pump-down may be provided by optional turbo pump 34 which may be isolated from the chamber and exhaust port by gate valves 35, 36. Wafer port 38 allows for transfer of wafers into and out of the chamber. This transfer may be manual or may be controlled by a robot. Heater cartridges 39 allow modification of the chamber temperature. Inside the chamber, the wafer rests on a wafer support (not shown). The wafer support may be composed of three pins which narrow to points at the top to minimize the area of contact with the wafer. Optionally, these pins may be connected together to form a single piece. Preferably, the pins are positioned to make contact at the edge of the wafer. The pins may be made of a ceramic such as sapphire or any other material which is stable at the temperatures used to process the wafer and is resistant to the chemistries used to process the wafer. An alternate wafer support may be a pedestal which the wafer rests on.

The apparatus may optionally be clustered with other tools which operate at reduced pressures. This allows wafers to be transferred between tools without exposing the wafers to ambient air.

The windows 20, if provided, may be made of sapphire to allow UV radiation from a UV source to impinge on substrate 12 in chamber 10. As discussed below, UV radiation provides a suitable method for increasing the temperature of the wafer. Substrate heating may alternatively be provided by an IR radiation source. In yet another alternative, heating of the substrate may be provided by a heater plate which the substrate rests on during processing, in which case windows 20 and UV radiation source 22 are unnecessary.

Figure 3:
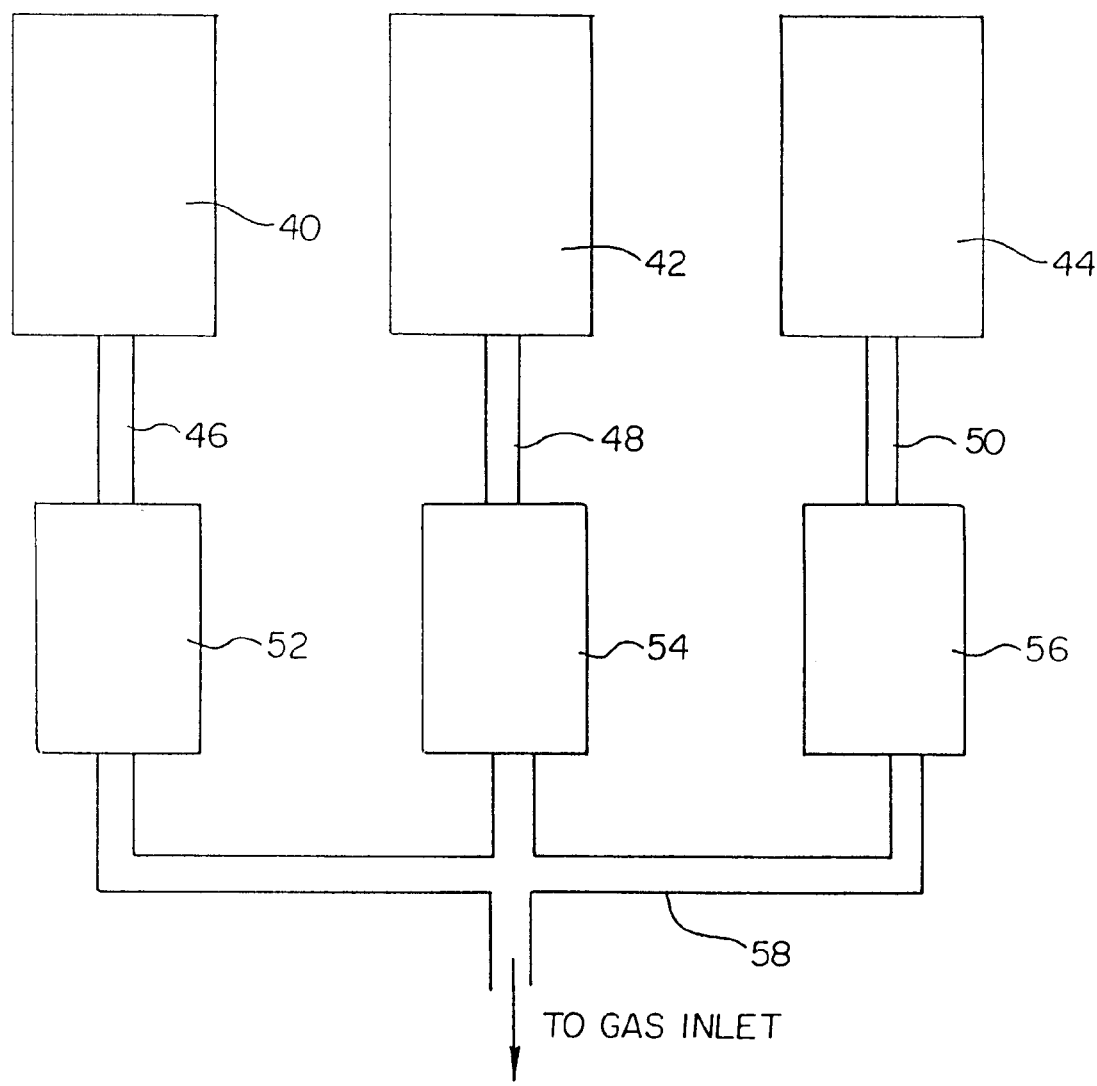
FIG. 3 shows a schematic of a gas delivery system suitable for use in carrying out the inventive process.

A schematic of a suitable gas delivery system is shown in FIG. 3. HF gas source 40 is connected to mass flow controller (MFC) 52 by pipe 46. Similarly, IPA source 42 is connected to MFC 54 by pipe 48, and $N_2$ source 44 is connected to MFC 56 by pipe 50. Pipe 46 may be a 0.25 inch diameter pipe of at least 12 inches in length. Suitably, it is heated to at least 70° C. in accord with the invention described in pending U.S. patent application Ser. No. 08/975,033, incorporated herein by reference. MFC 52 is also heated to 70° C. IPA source 42 is suitably heated to at least 60° C., while pipe 48 and MFC 54 are heated to 85° C. $N_2$ source 44, MFC 56 and pipe 50 may be at any temperature convenient for processing. The output of all three MFC's is mixed in pipe 58. Pipe 58 should be at a higher temperature than any of the initial gas sources 40, 42, or 44. Preferably pipe 58 is heated to 65° C. Pipe 58 is connected directly to gas inlet 30 in FIG. 1 or gas inlet 112 in FIG. 5 below.

Figure 4:
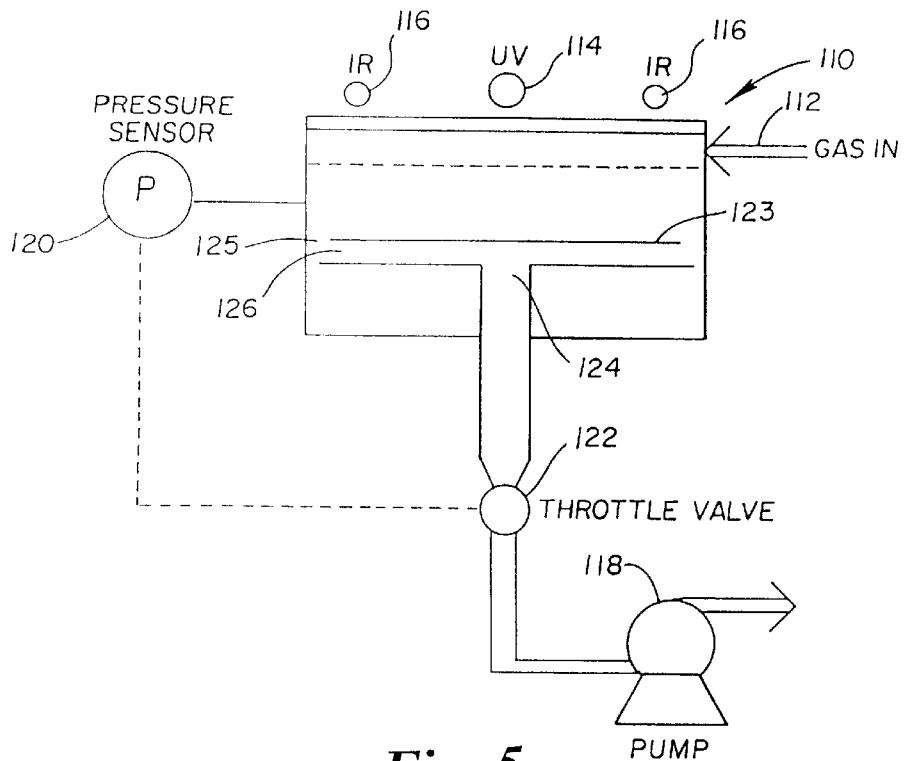
FIG. 4 is a schematic side view of an alternative apparatus suitable for performing the inventive process.
Figure 5:
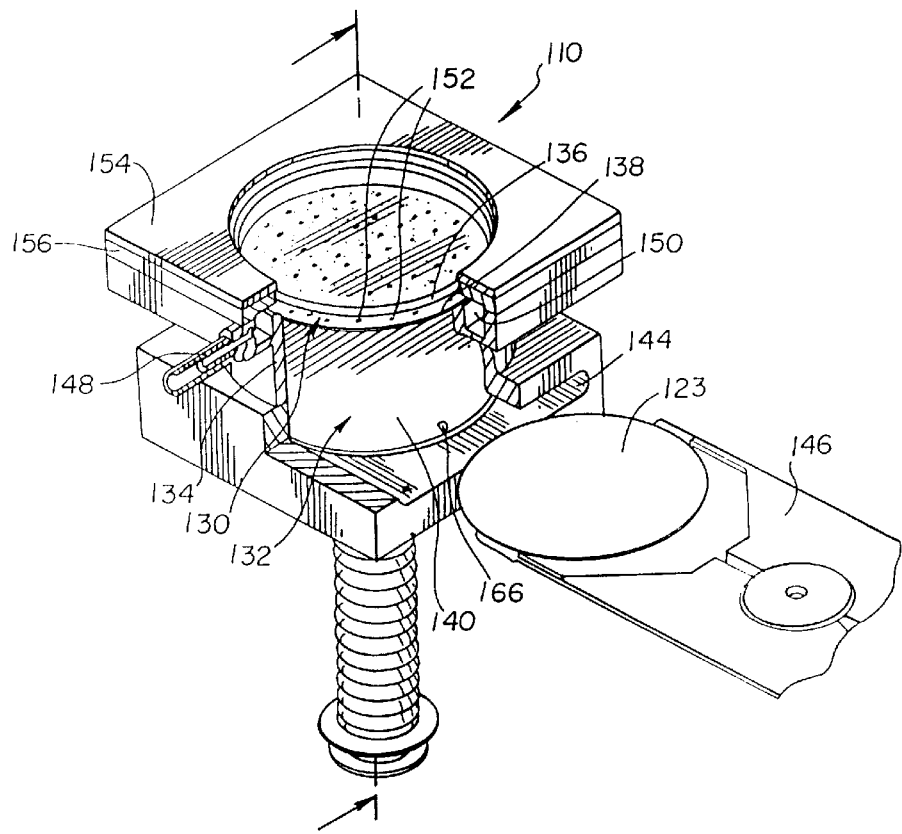
FIG. 5 is a perspective cut-away view of the device of FIG. 4 showing insertion of a wafer substrate.

FIGS. 4 and 5 illustrate an alternative chamber suitable for carrying out the invention. This chamber is described in detail in U.S. Pat. No. 5,580,421, incorporated herein by reference. FIG. 4 is a schematic diagram of the major component parts of the system. The reaction chamber is indicated generally at 110. The gas supply inlet is shown at 112 and is connected to the chamber 110. An optional ultraviolet lamp is shown at 114. Optional infrared lamps are shown at 116 which can be used to heat the substrate. A vacuum pump 118 is connected to the chamber 110. The total pressure in the chamber is measured by pressure sensor 120. Pressure sensor 120 controls the action of throttle valve 122 to allow for constant pressure processing in the chamber. In operation, the gas is fed into a first region of the chamber 110 (shown above the dotted line of FIG. 4). The gas uniformly flows from the first region to a second region, shown under the dotted line of FIG. 4 and located in reaction chamber 110, toward the surface of the wafer 123. The pressure drop between the inlet and the circular exhaust outlet 124 is small and a viscous flow regime is established in both the first and second regions. A peripheral gap 125 is defined between the edge of wafer 123 and the wall of chamber 110. A pumpout gap 126 is defined between the wafer 123 and the exhaust outlet 124, which is centrally located beneath the wafer 123. The peripheral gap 125, the pumpout gap 126, the centrally located circular exhaust outlet 124 and the pressure bias set at the exhaust outlet 124 create a uniform radial circumferential gas flow which causes the gas, after it has reacted with the wafer surface, to flow radially outward to the wafer edge, then through the peripheral gap 125, under the surface of the wafer and out the exhaust outlet 124.

FIG. 5 is a more detailed view of the chamber 110. The chamber 110 is a hermetically sealed chamber, constructed from aluminum and coated by a hardcoat anodization process, and is divided into two regions, a higher pressure gas inlet region, shown generally at 130, and a lower pressure reaction region, shown generally at 132. The gas inlet region 130 (first region discussed above in connection with FIG. 4) is defined by the chamber wall 134, a solid plate 136, and an optional perforated plate 138, each made of a material which is transparent to light of a selected range of wavelengths and inert so it does not react with the gas. In an embodiment the plates 136 and 138 are made of sapphire, which is transparent to both UV and IR wavelengths of light and is inert toward the gases used for treating the substrate. Plates 136 and 138 are transparent to UV and IR light, allowing the light from the UV lamps 114 and the IR lamp(s) 116 to penetrate to the surface of the substrate 123.

The reaction region 132 (second region discussed above in connection with FIG. 4) is defined by the chamber wall 134, the perforated plate 138 and a baffle plate 140 which slides vertically within the reaction region to define a load position and a processing position. The semiconductor substrate 123 is loaded into the chamber 110 through slot 144 using loading arm 146. When wafer 123 is loaded into the chamber, it is supported on pins 166 so that it defines a pumpout gap 126 (as shown in FIG. 4) between wafer 123 and baffle plate 140. In this particular apparatus gap 126 is about 8 mm. A gate valve (not shown) is used to seal the slot 144 during processing.

Gas flows are supplied through gas manifold 148 to annular channel 150, which opens into the gas inlet region 130. Gas is introduced into the annular channel 150 surrounding the chamber and then flows through the gap between the solid sapphire plate 136 and the perforated sapphire plate 138 and then through the perforations 152 in the perforated sapphire plate into the reaction region 132 between the perforated sapphire plate 138 and the baffle plate 140. The annular channel 150 is designed so that its flow conductance is larger compared to the flow conductance of the gap between the solid sapphire plate 136 and the perforated sapphire plate 138 so that the pressure in the annular channel 150 is approximately equal around the entire circumference even though the gas flows are introduced to the channel through a single small diameter tube 148. The isobaric nature of the annular ring 150 provides circumferential uniform flow of the gas from the edge to the center of the perforated plate 138. Further, the size and plurality of the perforations 152 in the perforated sapphire plate 138 are designed so that the flow conductance of the perforations 152 is much less than the flow conductance of the gap between the solid sapphire plate 136 and the perforated sapphire plate 138 so that the flow of gas through each perforation 152 is approximately equal. Top clamp 154 is used to hold solid sapphire plate 136 in place. Channel cover 156 together with chamber wall 134 defines the annular channel gap through which the gas flows enter into the gas inlet region 130.

The temperature of the wafer may be controlled by any suitable method. In one embodiment the wafer rests on a heater plate in the chamber. In another embodiment infra-red lamps provide a heat source for controlling the wafer temperature. In another embodiment the temperature of the wafer is raised to the desired processing temperature by ultraviolet (UV) radiation, as disclosed in pending U.S. application Ser. No. 08/955,355, incorporated herein by reference. Silicon and other semiconductor materials efficiently absorb UV light, in contrast to the metals typically used for construction of processing chambers. As a result, semiconductor substrates may be heated using UV radiation while minimizing heating in the surrounding processing chamber.

In the preferred apparatus, the UV lamp is located outside of the chamber. In this embodiment the chamber contains at least one window which allows transmission of UV light from the UV source to the substrate.

A suitable UV lamp is a 9 inch/7 millimeter bore linear, xenon-filled quartz flashlamp (made by Xenon corporation of Woburn, Mass.). A lamphouse suitable for use in the invention is provided with two such lamps and is supplied with 1500 Watts to power the lamps. Other sources of radiation, such as mercury lamps, may also be used as long as the source produces sufficient power in the wavelength range 0.1 to 1.0 microns and the output photons react with the particular chemical system of interest. A more, or less, powerful UV source may be used. Of course, the power of the lamp will determine how quickly the substrate may be heated. With two 1500 Watt lamphouses, one on the front side and one on the back side, the temperature of a 150 mm silicon wafer may be increased from room temperature to 200° C. in approximately 30 seconds. The flashlamp power supply comprises a power supply capable of delivering an input power of up to 1500 Watts to the lamphouse with a fixed input pulse. The lamphouse may simply be a device for mounting the UV source or it may also comprise one or more cylindrical parabolic or elliptical reflectors.

The UV controller may be any circuitry which when connected to the UV source can allow the UV source to deliver a desired amount of time averaged power. One method for controlling the time averaged power is through the use of a variable power supply. The Xenon 740 from Xenon corporation is an example of such a power supply which allows control over the number of pulses per second delivered by the lamphouse. Alternatively, the UV may be controlled manually by an operator.

The UV source may be run in an open loop without any temperature feedback during the heating step. If the UV source is a flashlamp, the low thermal mass allows pulse energy calibration thereby allowing for repeatable temperature control of the substrate in an open loop system. The chamber temperature may be controlled by a feedback mechanism associated with a feedback loop and resistive heater so as to maintain the chamber at a desired temperature after the initial UV heating step. In the preferred embodiment, the chamber is held at 50° C., which maintains the wafer at the preferred processing temperature of about 45° C. The set point for the chamber needed to maintain the wafer at 45° C. will vary depending on the size and configuration of the chamber.

Although 45° C. is the preferred processing temperature, other temperatures may be suitable depending on the application. Lowering the temperature will increase the etch rate, leading to decreased processing time. However, lower temperatures can lead to instability in the etch rate. Similarly, higher processing temperatures will have better etch rate stability but will require longer processing times due to slower oxide removal rates. Temperatures between about 40 and 50° C. generally provide an appropriate balance of these factors.

Once the desired chamber pressure and wafer temperature have been reached, the mixture of HF, IPA, and inert gas in the specific ratio of the invention is delivered to the chamber. In the preferred embodiment, these gases are delivered in a ratio of 25:1:25 as a flow of 2000 sccm of HF, 80 sccm of IPA, and 2000 sccm of $N_2$. These flows may be measured by mass flow controllers or any other suitable method for characterizing gas flows. The length of the HF/IPA/$N_2$ delivery step will depend on the particular substrate, as thicker oxide films will require longer process times. At the end of the HF/IPA/$N_2$ delivery step, the chamber is pumped down to below 1 Torr of total pressure. This will end the oxide removal step in a reproducible and controlled manner.

In the preferred embodiment, HF is delivered to the chamber using the method disclosed in pending U.S. patent application Ser. No. 08/975,033. Certain gases, such as hydrofluoric acid (HF) and acetic acid, pose special problems when attempting to accurately and precisely measure and deliver an amount of gas. At equilibrium most gases have an association number, or average number of molecules in a gas phase cluster, of about 1. A gas with an association number of about one is substantially unpolymerized with the majority of the gas molecules existing as monomers. A mass flow controller is a suitable device for measuring such gases because the thermodynamic properties monitored by a mass flow controller correlate in a simple manner with flow rate.

A few gases, however, such as hydrofluoric acid, pose special problems because the thermodynamic quantities a mass flow controller measures do not have the typical correlation with flow rate. This is due to the fact that HF has an association number greater than 1 for a wide range of temperatures and pressures far from their critical points. For example, at ambient temperature and pressure, HF has an association number near 3.5. This means that on average an HF molecule is a member of a cluster involving 3 to 4 HF molecules. The association number of HF is also a strong function of temperature and pressure under these conditions. This leads to the difficulties in monitoring HF flows in the usual way. Small changes in temperature and pressure can lead to measurable changes in the thermodynamic quantities a mass flow controller monitors, which can result in inaccurate and unreproducible measurements of the amount of HF gas flow.

These difficulties may be overcome by placing the HF gas in a state where the association number is one or substantially one. This is accomplished by modifying the temperature and pressure of the gas so that the association number is forced to one or close to one. By forcing the association number to be close to one, any instability in the properties of HF due to changes in association number is eliminated.

Prior to measurement with an MFC, the HF gas to be measured is heated to 65° C. or higher. For the flows of HF used in this invention, gaseous HF at 25° C. can be heated to 65° C. by passing the HF through at least 12 inches of 0.25 inch diameter pipe at 70° C. As detailed in the pending application, this places the HF in a state suitable for accurate and repeatable measurement. The HF is then measured in an MFC which is also heated to 70° C. Other methods for achieving accurate and repeatable measurement of HF gas may be found in the pending application.

Altering the temperature of the pipe is preferably accomplished using some form of heat tracing. Heat tracing involves applying a heating source, such as linear resistive heating tape, along the entire length of the exterior of an object to be heated and then insulating the object/heater combination. The heating source may be controlled by a single feedback loop for the entire heat tracing, or the heat tracing may be partitioned with an independent feedback loop controlling the temperature in different sections. This latter method allows for finer control of the temperature over large areas of heat tracing. A suitable thermocouple for monitoring the temperature of the line and providing information for the feedback loop is a type J thermocouple. Both the linear resistive heating tape and the type J thermocouple are available from Omega Engineering, Inc. of Stamford, Conn. An example of a suitable temperature controller is the model CN3402 controller available from Omega Engineering, Inc. Alternatively, other heaters such as heating coils or heat lamps may be used to heat the reservoir. In this embodiment, gas which is flowing through the pipe must spend enough time in the reservoir to attain a substantially unpolymerized state.

Once the gas is placed in a substantially unpolymerized state, it is then measured. A suitable measuring device is a thermal or pressure mass flow controller, such as a 2000 sccm nitrogen-calibrated thermal mass flow controller available from MKS Instruments, Inc. of Andover, Mass., but other devices may be used. Preferably, the measuring device should be in an appropriate condition to maintain the gas in a substantially unpolymerized state during the measurement.

Delivery of the IPA may be achieved using the Direct Vapor Delivery (DVD) method described in pending U.S. patent application Ser. No. 08/824,512, incorporated herein by reference. Liquid IPA is stored in a canister reservoir which is heated to 60 C. This generates a vapor pressure of gaseous IPA above the liquid of several hundred Torr. In our preferred embodiment, processing of the substrate takes place at pressures between 100 and 200 Torr. As a result, the vapor pressure of the IPA gas in the reservoir is sufficient to force flow through an MFC, ultimately allowing delivery of IPA gas to our process without the need for a carrier gas. Although 60° C. provides enough vapor pressure of IPA for our preferred embodiment, if flows of IPA greater than 100 sccm are desired, the temperature of the reservoir may need to be increased. Heating of the IPA reservoir may be accomplished by any suitable means, such as by use of resistive heating tape.

One method for determining the necessary length for the HF/IPA/$N_2$ delivery step is to calibrate the etch rate. A blanket thermal oxide is suitable for this calibration. Alternatively, a blanket deposited or chemical oxide may be used to obtain etch rate data for a specific oxide which will be present on the surface during device manufacture. An effective etch rate for a particular oxide can be determined by comparing ellipsometer measurements from before and after processing by the HF/IPA/N$_2$ process.

When processing patterned wafers, it may be desirable to allow oxide to remain on some portions of the surface after removing the oxide from the desired areas. Optionally, the surface of the wafer may be pretreated by exposing the surface to Cl$_2$ gas in the presence of UV radiation, as disclosed in pending U.S. patent application Ser. No. 08/739,884, incorporated herein by reference. This pretreatment removes organic contamination from oxide surfaces which improves the uniformity of the removal step. Thus, any remaining oxide will have a relatively uniform surface.

The delivery time for the HF/IPA/N$_2$ process should be selected based on the calibration data. The delivery time must be at least enough to remove all of the desired oxide. In the preferred embodiment, this delivery will last longer than the minimum time necessary for removal of the oxide. The last few atomic layers of an oxide often etch more slowly than bulk oxide, so some amount of 'overetch' should be included in the process time. Preferably the amount of overetch is sufficient to etch at least an additional 100 Å of thermal oxide, although longer overetch times are also acceptable. On the other hand, on patterned wafers it may be desirable to minimize the amount of overetch. During the overetch period, the oxides which are not targeted for complete removal will also be etched, and shorter overetch times may be desirable to minimize the amount of oxide lost in the non-target areas. As a result, the overetch time may need to be optimized for each individual application.

In one embodiment, the substrate may be pretreated with IPA prior to introduction of the HF/IPA/N$_2$ flows. A gas flow of 80 sccm of IPA with 2000 sccm of N$_2$ for 5 seconds provides one example of a suitable IPA pretreatment.

The HF/IPA/N$_2$ process treats the substrate to produce an improved surface for subsequent processing. One application which benefits from this improved surface is deposition of epitaxial silicon, as indicated in the following non-limiting examples.

EXAMPLES

In the following examples all of the wafers in the examples were processed in an apparatus similar to the chamber depicted in FIGS. 4 and 5. The only differences were that the optional perforated sapphire plate 138 and the optional UV and IR lamps were not present.

Comparative Examples 1–2,

Example 1

Three 150 mm prime silicon wafers with 250 Å of blanket thermal oxide on the surface were processed in the process apparatus prior to epitaxial silicon deposition. The conditions for each run are detailed in Table 1. Wafers A and B correspond to Comparative Examples 1 and 2, respectively. Wafer C corresponds to Example 1. Prior to placing each wafer into the chamber, the chamber was purged with N$_2$ gas and then pumped out to below 1 Torr. The wafer was then placed in the chamber on a wafer support which included a heating plate. Next the chamber was backfilled with N$_2$ to a pressure of 150 Torr. During the pressure modification, the heater in the wafer support was used to raise the temperature of the wafer to 45° C. After stabilization of the pressure and temperature, a flow of HF, IPA, and N$_2$ was introduced into the chamber according to one of the three conditions listed in Table 1. The flow was maintained for 40 seconds, at which point all gas flows into the chamber were stopped and the chamber was evacuated to below 1 Torr of pressure.

After processing according to the conditions in Table 1, the wafers were transferred externally (including atmospheric exposure) to an Applied Materials Centura HTF epitaxial deposition chamber for epitaxial silicon deposition. Approximately 2500 Å of silicon was deposited at a temperature of 850° C. using SiH$_2$Cl$_2$ gas. No hydrogen bake was performed prior to the deposition. After silicon deposition, the quality of the deposition was determined by counting the number of light point defects (LPD) on the silicon surface using a Tencor Surfscan 6200 made by KLA-Tencor Corporation of San Jose, Calif. Wafer A showed over 13,000 LPDs of greater than 0.136 micrometers after scanning roughly 40% of the surface area. Wafer B gave a similar result, with over 13,000 LPDs in the same area as wafer A. A scan over the remaining portion of the surface of Wafer B resulted in a total LPD count of over 29,000 for the wafer. This corresponds to defect density of approximately 150 defects/cm$^2$ for Wafers A and B. Wafer C, however, processed according to the invention, exhibited a total of roughly 2,300 LPDs over the entire wafer surface, or less than 15 defects/cm$^2$. This much lower defect density indicates a higher quality epitaxial layer.

TABLE 1

Epitaxial Deposition Results
Process conditions; 2500 Å Si deposition, T = 45° C., p = 150 Torr, flows in sccm, 250 Å thermal oxide starting surface

| Run | Wafer | Flow ratio HF:IPA:N$_2$ | Light Point Defects |
|---|---|---|---|
| CEx 1 | A | 1500:60:0 | >13,000 |
| CEx 2 | B | 2000:120:500 | >29,000 |
| Ex 1 | C | 2000:80:2000 | ~2,300 |

CBx = Comparative Example
Ex = Example

While applications like epitaxial silicon deposition represent the eventual utility of this invention, deionized water droplet contact angle measurements provide a simple and convenient method for evaluating the effectiveness of the process. The absolute values of contact angle measurements vary depending on the nature of the equipment used and conditions during the measurement. Trends in contact angle data, however, are highly reproducible. It has been observed that wafers processed according to the invention exhibit a local maximum in contact angle. Although the absolute value of the contact angle at this maximum can differ based on experimental and environmental conditions, a local maximum remains visible for wafers processed according to the inventive process.

Comparative Examples 3–6,

Example 2

In order to collect contact angle data, a second set of wafers was processed under conditions similar to those used for the epitaxial deposition on Wafers A, B, and C. Table 2 shows the results of the contact angle measurements taken on wafers processed according to the conditions outlined in the table. Wafers D, E, and F were processed in an identical manner to wafers A, B, and C until the end of the HF/IPA/N$_2$ step. At that point, the wafers were transferred to a goniometer instead of the deposition tool. Wafer F yielded the highest contact angle, corresponding to the inventive process which achieved the best results during the subsequent epitaxial deposition. Wafers G and H, representing Comparative Examples 5 and 6, were processed in a similar manner and provide additional contact angle data to determine the influence of nitrogen flow.

TABLE 2

Contact Angle (CA) I
Process conditions: T = 45° C., p = 150 Torr,
flows in sccm, 40 second HF/N$_2$/IPA process

| | Wafer | Flow ratio HF:IPA:N$_2$ | CA (degrees) |
|---|---|---|---|
| CEx 3 | D | 1500:60:0 | 73 |
| CEx 4 | E | 2000:120:500 | 68 |
| Ex 2 | F | 2000:80:2000 | 76 |
| CEx 5 | G | 2000:80:1000 | 74 |
| CEx 6 | H | 2000:80:4000 | 73 |

Comparative Examples 7–13,

Examples 3–5

Table 3 details the conditions for a separate series of experiments designed to determine how process variations change the contact angle of the resulting surface. Blanket thermal oxide wafers with ~150 Å of oxide were processed in the equipment used for the previous examples. The wafers were loaded into the N$_2$ environment inside the chamber and placed on the wafer support. The pressure for each run was modified to the value indicated in Table 3. During the pressure modification, the temperature of the wafer was increased to 45° C. by use of the heater plate in the wafer support. Once the pressure and temperature in the chamber stabilized, the flows of HF, IPA, and N$_2$ indicated in Table 3 were activated for the specified process time. At the end of the process time the chamber was evacuated to below 1 Torr and then purged with N$_2$. Contact angle measurements were performed on the resulting surfaces. Under these conditions, the process used to treat Wafers C and F resulted in at least 1000 Å of bulk thermal oxide etching. This corresponds to an overetch of roughly 850 Å for Wafers I and J. The amount of overetch for the other processes described in Table 3 will differ due to the process changes.

TABLE 3

Experimental conditions
Process conditions: T = 45° C., flows in sccm, oxide depth in Å

| Wafer | Flow ratio HF:IPA:N$_2$ | p (Torr) | Starting oxide thickness | Process time |
|---|---|---|---|---|
| Ex 3 | I | 2000:80:2000 | 150 | 149 | 40 sec |
| Ex 4 | J | 2000:80:2000 | 150 | 152 | 40 sec |
| CBx 7 | K | 2000:80:2000 | 75 | 161 | 40 sec |
| CEx 8 | L | 2000:80:2000 | 300 | 122 | 40 sec |
| CEx 9 | M | 2000:40:2000 | 150 | 154 | 40 sec |
| CEx 10 | N | 2000:160:2000 | 150 | 152 | 40 sec |
| CEx 11 | O | 1000:80:2000 | 150 | 151 | 40 sec |
| CEx 12 | P | 1000:80:2000 | 150 | 155 | 60 sec |
| CEx 13 | Q | 2000:80:1000 | 150 | 152 | 40 sec |
| Ex 5 | R | 2000:80:2000 | 150 | 152 | 60 sec |

Table 4 shows the variation in contact angle due to changes in total pressure based on the contact angle results from Wafers I, J, K, and L. Wafers I and J are identical to provide an accurate measure of how the preferred process performs. Wafer K demonstrates that reduced total pressure leads to a decrease in contact angle while Wafer L shows that increasing the process pressure also reduces the contact angle. Thus, the preferred process exhibits a local maximum in contact angle with respect to total process pressure.

TABLE 4

Contact Angle II - Pressure Variations
Process Conditions: T = 45° C., flows in sccm, 40 second HF/N$_2$/IPA exposure

| | Wafer | Flow ratio HF:IPA:N$_2$ | p (Torr) | CA (deg) |
|---|---|---|---|---|
| Ex 3 | I | 2000:80:2000 | 150 | 73 |
| Ex 4 | J | 2000:80:2000 | 150 | 73 |
| CEx 7 | K | 2000:80:2000 | 75 | 68 |
| CEx 8 | L | 2000:80:2000 | 300 | 69 |

Table 5 shows the variation in contact angle due to changes in the flow rate of IPA. Again, Wafers I and J provide a basis for comparison. Wafer M shows the drop in contact angle for a reduced IPA flow while Wafer N shows that increased IPA flow also lowers the contact angle.

TABLE 5

Contact Angle III - IPA Variations
Process Conditions: T = 45° C., flows in sccm, 40 second HF/N$_2$/IPA exposure

| | Wafer | Flow ratio HF:IPA:N$_2$ | p (Torr) | CA (deg) |
|---|---|---|---|---|
| Ex 3 | I | 2000:80:2000 | 150 | 73 |
| Ex 4 | J | 2000:80:2000 | 150 | 73 |
| CEx 9 | M | 2000:40:2000 | 150 | 64 |
| CEx 10 | N | 2000:160:2000 | 150 | 69 |

Table 6 details the variation in contact angle due to changes in total flow rate, as represented by changing the amount of N$_2$ delivered during the process. As discussed previously, Table 2 contained data from experiments run at the time of the epitaxial silicon deposition study. Wafers F, G, and H from Table 2 are included in Table 6 for convenience. Wafer F represents the preferred process which shows a local maximum with respect to lower or higher N$_2$ flow rates, as shown by the results from Wafers G and H. Wafers I, J, and O show that this effect is repeatable with respect to reduced flow rates. Note that although the absolute value of the contact angle varies between the apparently identical Wafers F, I, and J, the local maximum character of the contact angle for these wafers is retained.

TABLE 6

Total flow II
Process Conditions: T = 45° C., flows in sccm, 40 second HF/N$_2$/IPA exposure

| | Wafer | Flow ratio HF:IPA:N$_2$ | p (Torr) | CA (deg) |
|---|---|---|---|---|
| Ex 2 | F | 2000:80:2000 | 150 | 76 |
| CEx 5 | G | 2000:80:1000 | 150 | 74 |
| CEx 6 | H | 2000:80:4000 | 150 | 73 |
| Ex 3 | I | 2000:80:2000 | 150 | 73 |
| Ex 4 | J | 2000:80:2000 | 150 | 73 |
| CEx 11 | O | 2000:80:1000 | 150 | 71 |

Table 7 shows that the measured contact angle is stable with respect to changes in the amount of overetch. This shows that once the wafer is treated for a sufficient amount of time to remove all oxide from the desired areas, additional overetch will not degrade the quality of the surface.

TABLE 7

Overetch
Process Conditions: T = 45° C., flows in sccm

| | Wafer | Flow ratio HF:IPA:N$_2$ | p (Torr) | Process time | CA (deg) |
|---|---|---|---|---|---|
| Ex 3 | I | 2000:80:2000 | 150 | 40 sec | 73 |
| Ex 4 | J | 2000:80:2000 | 150 | 40 sec | 73 |
| Ex 5 | R | 2000:80:2000 | 150 | 60 sec | 74 |
| CEx 12 | P | 1000:2000:80 | 150 | 40 sec | 71 |
| CEx 13 | Q | 1000:2000:80 | 150 | 60 sec | 71 |

While the above examples illustrate our inventive process, other applications of our process are possible and will be evident to those skilled in the art.

What is claimed is:

1. A process for treating a semiconductor substrate to remove undesired oxide and achieve an improved surface quality comprising:
   a) placing a substrate in a chamber;
   b) treating said substrate with gas phase HF, IPA, and an inert gas at below ambient pressure for a time sufficient to remove said undesired oxide from the surface of said substrate, wherein said below ambient pressure is between 125 and 175 Torr and the volume basis ratio of HF:IPA:inert gas is 20–30:1:20–30; and
   c) reducing the pressure in the chamber below the below ambient pressure to controllably terminate the process.

2. The process of claim 1 wherein said inert gas is N$_2$.

3. The process of claim 1 wherein the ratio of HF:IPA:inert gas is 22–28:1:22–28.

4. The process of claim 3 wherein the ratio of HF:IPA:inert gas is 25:1:25.

5. The process of claim 4 wherein said ratio of treating gases is achieved by flowing 2000 sccm of HF, 80 sccm of IPA, and 2000 sccm of N$_2$ into said chamber.

6. The process of claim 1 wherein, at the time of initiation of said treating step, an inert gas atmosphere is established in the chamber.

7. The process of claim 6 wherein said inert gas atmosphere consists of N$_2$.

8. The process of claim 1 wherein the length of said treating step is sufficient to overetch said oxide layer.

9. The process of claim 1 further comprising depositing a film on said substrate after said treating step.

10. The process of claim 9 wherein said film is a silicon film.

11. The process of claim 10 wherein said silicon film is deposited on said substrate without an intermediate hydrogen bake step between said treating and depositing steps.

12. The process of claim 1 wherein said below ambient pressure is 150 Torr.

13. The process of claim 1 wherein said substrate is held at a temperature of 45° C. during said treating step.

14. The process of claim 1 further comprising a pretreatment step of introducing Cl$_2$ gas into the chamber in the presence of ultraviolet light prior to said treating step.

15. The process of claim 1 further comprising a pretreatment step of introducing IPA and inert gas into the chamber in the ratio of 1:25 prior to said treating step.

16. The process of claim 1 further comprising the step of halting the flow of the gas phase HF, IPA and the inert gas to the chamber subsequent to the treating step and prior to the reducing step.

17. The process of claim 1 where during the reducing step, the pressure in the chamber is reduced to below 1 torr to end the process.

18. A process for treating a semiconductor substrate comprising:
   a) placing a substrate in a chamber with an inert gas environment,
   b) establishing a pressure in said chamber of between 125 and 175 Torr,
   c) treating said substrate with HF, IPA, and inert gas in a volume basis ratio of HF:IPA:inert gas of 20–30:1:20–30 for a time sufficient to remove undesired oxide layers from said substrate, and
   d) epitaxially depositing a film on said treated substrate without an intermediate hydrogen bake step between said treating and depositing steps.

19. The process of claim 18 wherein the substrate is at a temperature during said treating step of about 45° C.

20. The process of claim 18 wherein said film is a silicon film.

21. A process for treating a semiconductor substrate comprising:
   a) placing a substrate in a chamber with an inert gas environment,
   b) establishing a pressure in said chamber of between 125 and 175 Torr,
   c) treating said substrate with HF, IPA, and inert gas in the ratio of 25:1:25 for a time sufficient to remove undesired oxide layers from said substrate, and
   d) maintaining said treatment for a time sufficient to overetch said oxide layers.

22. A process for producing an epitaxial silicon layer on a semiconductor substrate comprising:
   a) placing a substrate in a chamber, and
   b) treating said substrate with gas phase HF, IPA, and an inert gas at below ambient pressure for a time sufficient to remove said undesired oxide from the surface of said substrate, and
   c) depositing an epitaxial silicon layer on the surface of the substrate wherein
   said below ambient pressure is between 125 and 175 Torr and the volume basis ratio of HF:IPA:inert gas is 20–30:1:20–30.

23. A process for treating a semiconductor substrate to remove undesired oxide and achieve an improved surface quality comprising:
   a) placing a substrate in a chamber;
   b) providing a gaseous HF flow at an HF temperature, a gaseous IPA flow at an IPA temperature and an inert gas flow at an inert gas temperature;
   c) combining the gaseous HF flow, the gaseous IPA flow and the inert gas flow;
   d) heating the combined flow to a temperature in excess of the greater of the HF temperature, the IPA temperature and the inert gas temperature;
   e) treating said substrate with said heated combined flow at below ambient pressure for a time sufficient to remove said undesired oxide from the surface of said substrate, wherein said below ambient pressure is between 125 and 175 Torr and the volume basis ratio of HF:IPA:inert gas is 20–30:1:20–30.

24. A process for treating a semiconductor substrate to remove undesired oxide and achieve an improved surface quality comprising:

a) placing a substrate in a chamber;
b) providing a source of HF gas, a source of IPA gas and a source of inert gas;
c) controlling the HF temperature and the pressure of the HF gas to place the HF gas in a substantially unpolymerized state;
d) measuring a quantity of said substantially unpolymerized HF gas;
e) combining the quantity of substantially unpolymerized HF gas, the IPA gas and the inert gas;
f) treating said substrate with said combined gasses at below ambient pressure for a time sufficient to remove said undesired oxide from the surface of said substrate, wherein said below ambient pressure is between 125 and 175 Torr and the volume basis ratio of HF:IPA:inert gas is 20–30:1:20–30.

25. The method of claim 24 wherein the temperature of the HF gas is at least 65° C.

26. The method of claim 24 wherein the HF gas is characterized by an association state during the controlling step and the temperature and pressure of the HF gas during the controlling step are controlled so that the association state of the HF gas is about 1.

27. A process for treating a semiconductor substrate to remove undesired oxide and achieve an improved surface quality comprising:

a) placing a substrate in a chamber;
b) pretreating the substrate with IPA gas; and
c) treating said substrate with gas phase HF, IPA, and an inert gas at below ambient pressure for a time sufficient to remove said undesired oxide from the surface of said substrate, wherein said below ambient pressure is between 125 and 175 Torr and the volume basis ratio of HF:IPA:inert gas is 20–30:1:20–30.

28. The method of claim 27 wherein the IPA gas is generated by heating liquid IPA to form IPA vapor.

29. A process for treating a semiconductor substrate to remove undesired oxide and achieve an improved surface quality comprising:

a) placing a substrate in a chamber;
b) heating the substrate by the application thereto of UV radiation in the absence of a reactive gas; and
c) treating said substrate with gas phase HF, IPA, and an inert gas at below ambient pressure for a time sufficient to remove said undesired oxide from the surface of said substrate, wherein said below ambient pressure is between 125 and 175 Torr and the volume basis ratio of HF:IPA:inert gas is 20–30:1:20–30.

* * * * *